(12) United States Patent
Do et al.

(10) Patent No.: US 11,222,831 B2
(45) Date of Patent: Jan. 11, 2022

(54) STACKED INTEGRATED CIRCUIT DEVICES

(71) Applicant: Samsung Electronics Co., Ltd., Suwon-si (KR)

(72) Inventors: Jung Ho Do, Hwaseong-si (KR); Seungyoung Lee, Albany, NY (US)

(73) Assignee: Samsung Electronics Co., Ltd.

( * ) Notice: Subject to any disclaimer, the term of this patent is extended or adjusted under 35 U.S.C. 154(b) by 7 days.

(21) Appl. No.: 16/947,241

(22) Filed: Jul. 24, 2020

(65) Prior Publication Data
US 2021/0384106 A1 Dec. 9, 2021

Related U.S. Application Data

(60) Provisional application No. 63/034,525, filed on Jun. 4, 2020.

(51) Int. Cl.
*H01L 27/02* (2006.01)
*H01L 23/48* (2006.01)
*H01L 27/088* (2006.01)

(52) U.S. Cl.
CPC ........ *H01L 23/481* (2013.01); *H01L 27/0207* (2013.01); *H01L 27/088* (2013.01)

(58) Field of Classification Search
CPC ....... H01L 23/00; H01L 23/48; H01L 23/481; H01L 27/02; H01L 27/0207; H01L 27/088; H01L 27/06; H01L 27/0629; H01L 27/0635; H01L 27/07; H01L 27/0711; H01L 27/0738; H01L 27/0623; H01L 27/067; H01L 27/0647; H01L 27/0722; H01L 27/075; H01L 27/0783; H01L 27/1022; H01L 27/1026

USPC ......................................................... 257/390
See application file for complete search history.

(56) References Cited

U.S. PATENT DOCUMENTS

| 6,625,051 | B2* | 9/2003 | Sekiguchi | ................ G11C 5/06 365/63 |
| 7,923,755 | B2* | 4/2011 | Mizushino | ........ H01L 27/11807 257/200 |
| 9,653,413 | B2 | 5/2017 | Frederick, Jr. et al. | |
| 10,510,774 | B2 | 12/2019 | Debacker et al. | |
| 2008/0169487 | A1* | 7/2008 | Shimbo | ............... H01L 27/0207 257/207 |
| 2011/0241121 | A1* | 10/2011 | Kwon | ................. H01L 27/1104 257/369 |
| 2018/0166386 | A1 | 6/2018 | Biswas et al. | |
| 2019/0096805 | A1 | 3/2019 | Chen et al. | |

(Continued)

*Primary Examiner* — Chuong A Luu
(74) *Attorney, Agent, or Firm* — Myers Bigel, P.A.

(57) ABSTRACT

Stacked integrated circuit devices may include standard cells including a first standard cell in a first row and a second standard cell in a second row immediately adjacent to the first row. Each of the standard cells may include an upper transistor and a lower transistor. The upper transistor may include an upper active region, an upper gate structure, and an upper source/drain region. The lower transistor may include a lower active region, a lower gate structure, and a lower source/drain region. Each of the standard cells may also include a power line and a power via electrically connecting the power line to the lower source/drain region. The power via of the first standard cell and the power via of the second standard cell may be aligned with each other along the first direction.

20 Claims, 17 Drawing Sheets

(56) References Cited

U.S. PATENT DOCUMENTS

| | | |
|---|---|---|
| 2019/0288004 A1 | 9/2019 | Smith et al. |
| 2019/0355749 A1 | 11/2019 | Do et al. |
| 2020/0042668 A1 | 2/2020 | Peng et al. |

* cited by examiner

STACKED INTEGRATED CIRCUIT DEVICES

CROSS-REFERENCE TO RELATED APPLICATION

This application claims priority to U.S. Provisional Application Ser. No. 63/034,525, entitled STACKED DEVICES, filed in the USPTO on Jun. 4, 2020, the disclosure of which is hereby incorporated by reference herein in its entirety.

FIELD

The present disclosure generally relates to the field of electronics and, more particularly, to stacked integrated circuit devices.

BACKGROUND

Stacked integrated devices including standard cells have been researched because of their high integration density. However, stacked integrated devices may include an extra space adjacent to a cell boundary for electrical isolation between elements of adjacent standard cells, thus increasing device size.

SUMMARY

According to some embodiments of the present inventive concept, integrated circuit devices may include a plurality of standard cells arranged on a substrate in multiple rows that each extend in a first direction. The plurality of standard cells may include a first standard cell in a first row and a second standard cell in a second row that is immediately adjacent to the first row. Each of the plurality of standard cells may include an upper transistor and a lower transistor between the substrate and the upper transistor. The upper transistor may include an upper active region, an upper gate structure on the upper active region, and an upper source/drain region on the upper active region. The lower transistor may include a lower active region, a lower gate structure on the lower active region, and a lower source/drain region on the lower active region. Each of the plurality of standard cells may also include a power line and a power via electrically connecting the power line to the lower source/drain region. The power via of the first standard cell and the power via of the second standard cell may be aligned with each other along the first direction.

According to some embodiments of the present inventive concept, integrated circuit devices may include a plurality of standard cells arranged on a substrate in multiple rows that each extend in a first direction. The plurality of standard cells may include a first standard cell in a first row and a second standard cell in a second row that is immediately adjacent to the first row. The integrated circuit devices may also include a shared power line extending along an interface between the first row and the second row. Each of the plurality of standard cells may include an upper transistor and a lower transistor between the substrate and the upper transistor. The upper transistor may include an upper active region, an upper gate structure on the upper active region, and first and second upper source/drain regions on the upper active region. The lower transistor may include a lower active region, a lower gate structure on the lower active region, and first and second lower source/drain regions on the lower active region. Each of the plurality of standard cells may also include a power via electrically connecting the shared power line to the first lower source/drain region and an output via electrically connecting the second lower source/drain region and the second upper source/drain region. The power via of the first standard cell may be spaced apart from the output via of the first standard cell by a first distance in a second direction that is perpendicular to the first direction, the power via of the second standard cell may be spaced apart from the output via of the second standard cell by a second distance in the second direction, and the first distance may be different from the second distance.

According to some embodiments of the present inventive concept, integrated circuit devices may include a first plurality of standard cells arranged in a first direction and a second plurality of standard cells that are arranged in the first direction and contact the first plurality of standard cells. An interface between the first plurality of standard cells and the second plurality of standard cells may define a cell boundary. The first plurality of standard cells and the second plurality of standard cells each may include an upper transistor on a substrate and a lower transistor between the substrate and the upper transistor. The upper transistor may include an upper active region, an upper gate structure on the upper active region, and an upper source/drain region on the upper active region. The lower transistor may include a lower active region, a lower gate structure on the lower active region, and a lower source/drain region on the lower active region. The first plurality of standard cells and the second plurality of standard cells may also include an output via that electrically connects the lower source/drain region and the upper source/drain region. The first plurality of standard cells may include a first standard cell, and the output via of the first standard cell overlaps the cell boundary.

DETAILED DESCRIPTION

A stacked standard cell was introduced to reduce its area to close to half of an area of its corresponding non-stacked standard cell. However, when two stacked standard cells immediately adjacent to each other in a cell height direction both include their output vias adjacent to a cell boundary therebetween, an extra space between the output vias has to be provided to electrically isolate the output vias. According to some embodiments of the present inventive concept, stacked standard cells may be designed and arranged to place output via(s) of only one of two standard cells immediately adjacent to each other in a cell height direction adjacent to a cell boundary therebetween, and thus an extra space between the output vias may not be provided. As used herein, the phrase "two elements immediately adjacent to each other" (or similar language) refers to configurations where two elements are adjacent to each other without any other like element located between the two elements. For example, two standard cells are immediately adjacent to each other in a cell height direction when no intervening standard cell is provided between the two standard cells in the cell height direction.

According to some embodiments of the present inventive concept, a single integrated circuit device (e.g., a single chip) may include multiple standard cells therein. A standard cell may be, for example, an inverter, a 2-input NAND gate, a 3-input NAND gate, a 2-input NOR, a 3-input NOR, an And-Or inverter (AOI), an Or-And inverter (OAI), an XNOR gate, an XOR gate, a multiplexer (MUX), a latch, or a D-flip-flop.

Standard cells of an integrated circuit device according to example embodiments of the present inventive concept are described herein as inverters for convenience of explanation. However, an integrated circuit device according some embodiments of the present inventive concept may include various standard cells such as a 2-input NAND gate and an OAL Further, in most example embodiments of the present inventive concept, standard cells are described as horizontal channel devices in which a channel current flows in a horizontal direction that is parallel to a surface of a substrate for convenience of explanation. However, in some embodiments, standard cells may be vertical channel devices in which a channel current flows in a vertical direction that is perpendicular to a surface of a substrate. The vertical channel devices may include vertical field effect transistors (VFET) therein.

Figure 1:
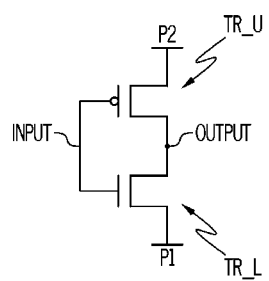
FIG. 1 is a circuit diagram of an inverter according to some embodiments of the present inventive concept.
Figure 2A:
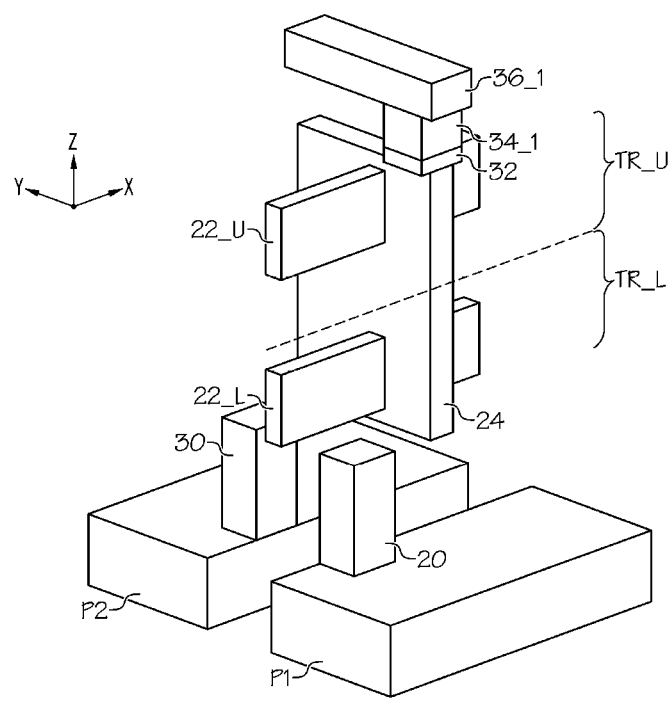
FIGS. 2A and 2B are perspective views of the inverter of FIG. 1 according to some embodiments of the present inventive concept.
Figure 2B:
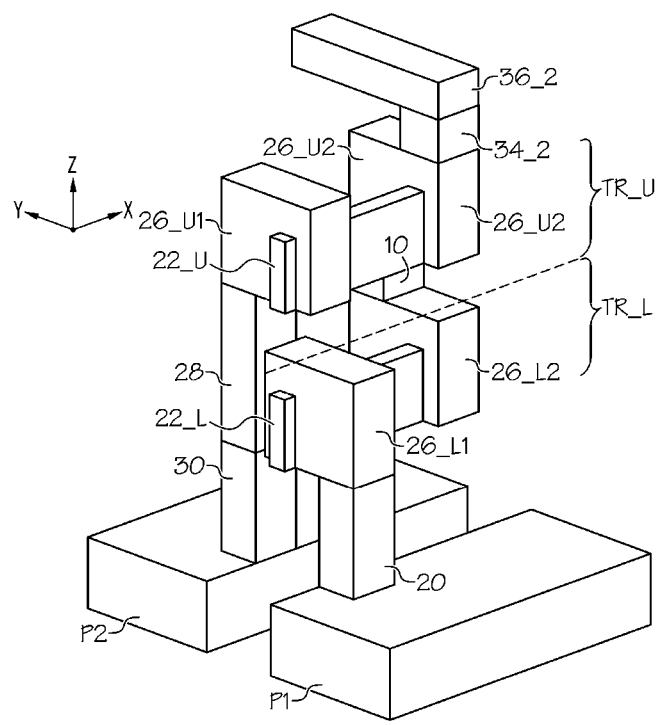

FIG. 1 is a circuit diagram of an inverter according to some embodiments of the present inventive concept, and FIGS. 2A and 2B are perspective views of the inverter of FIG. 1 according to some embodiments of the present inventive concept. Groups of elements of the single inverter are shown respectively in FIGS. 2A and 2B for simplicity of illustration, and thus each of FIGS. 2A and 2B shows some elements (but not all elements) of the single inverter.

Referring to FIGS. 1, 2A, and 2B, an inverter may include a lower transistor TR_L (e.g., an N-type transistor) and an upper transistor TR_U (e.g., a P-type transistor). The lower transistor TR_L and the upper transistor TR_U may be configured to receive a common input Input and may be configured to output a common output Output. Although not illustrated in FIGS. 2A and 2B, various insulating layers (e.g., a first insulating layer 42, a second insulating layer 44, and a third insulating layer 46 in FIG. 5A) may be provided between elements for electrical isolation therebetween.

The lower transistor TR_L may be connected to a first power line P1, and the upper transistor TR_U may be connected to a second power line P2. The first power line P1 may be connected to a first power having a first voltage (e.g., a source voltage). For example, the first voltage may be an electrical ground voltage. The second power line P2 may be connected to a second power having a second voltage (e.g., a drain voltage). The phrase "an element A connected to an element B" (or similar language) as used herein means that the element A is physically and/or electrically connected to the element B.

In some embodiments, each of the first power line P1 and the second power line P2 may extend in a first direction X and may be spaced apart from each other in a second direction Y as illustrated in FIG. 2A. The first direction X may be parallel to a surface of a substrate (e.g., a substrate 100 in FIG. 5A) and may be referred to as a first horizontal direction. The second direction Y may also be parallel to the surface of the substrate and may be referred to as a second horizontal direction. The first direction X may traverse the second direction Y. In some embodiments, the first direction X may be perpendicular to the second direction Y. As used herein, "an element A extends in a direction B" (or similar language) means that the element A extends longitudinally in the direction B.

The lower transistor TR_L may include a lower active region 22_L and first and second lower source/drain regions 26_L1 and 26_L2 on the lower active region 22_L. In some embodiments, the lower active region 22_L may extend in the first direction X as illustrated in FIG. 2A. The first and second lower source/drain regions 26_L1 and 26_L2 may contact the lower active region 22_L and may be spaced apart from each other in the first direction X. "Active region" as used herein refers to a region in which a channel of a transistor is formed when the transistor is turned on. Accordingly, "active region" may be interchangeable with "channel region."

The first lower source/drain region 26_L1 may be electrically connected to the first power line P1 through a first power via 20. In some embodiments, the first power via 20 may contact the first power line P1 and may protrude from the first power line P1 in a third direction Z. The third direction Z may be perpendicular to both the first direction X and the second direction Y and may be referred to as a vertical direction. In some embodiments, the first power via 20 may contact the first lower source/drain region 26_L1 as illustrated in FIG. 2B. However, in some embodiments, the first power via 20 and the first lower source/drain region 26_L1 may be electrically connected through a routing contact (e.g., a first lower routing contact 27_L1 in FIG. 5A).

The upper transistor TR_U may include an upper active region 22_U and first and second upper source/drain regions 26_U1 and 26_U2 on the upper active region 22_U. In some embodiments, the upper active region 22_U may extend in the first direction X as illustrated in FIG. 2A. The first and second upper source/drain regions 26_U1 and 26_U2 may contact the upper active region 22_U and may be spaced apart from each other in the first direction X.

Although FIGS. 2A and 2B illustrate each of the lower active region 22_L and the upper active region 22_U as a single active region having a particular shape, the present inventive concept is not limited thereto. In some embodiments, each of the lower active region 22_L and the upper active region 22_U may include multiple nanosheets stacked in the third direction Z, and each of the lower transistor TR_L and the upper transistor TR_U may be a Multi-Bridge Channel Field Effect Transistor (MBCFET).

The first upper source/drain region 26_U1 may be electrically connected to the second power line P2 through a vertical contact 28 and a second power via 30. In some embodiments, the vertical contact 28 may be omitted, and the first upper source/drain region 26_U1 may contact the second power via 30. The second power via 30 may contact the second power line P2 and may protrude from the second power line P2 in the third direction Z.

In some embodiments, the second power via 30 may contact the first upper source/drain region 26_U1 as illustrated in FIG. 2B. However, in some embodiments, the second power via 30 and the first upper source/drain region 26_U1 may be electrically connected through a routing contact (e.g., a first upper routing contact 27_U1 in FIG. 5A).

The inverter may also include a gate structure 24 on the lower active region 22_L and the upper active region 22_U. In some embodiments, the gate structure 24 may contact both the lower active region 22_L and the upper active region 22_U and thus may be shared by the lower transistor TR_L and the upper transistor TR_U. A lower portion of the gate structure 24 may be between the first and second lower source/drain regions 26_L1 and 26_L2 and may be referred to as a lower gate structure. An upper portion of the gate structure 24 may be between the first and second upper source/drain regions 26_U1 and 26_U2 and may be referred to as an upper gate structure. Although FIG. 2A illustrates that the lower portion and the upper portion of the gate structure 24 are portions of the single gate structure 24, the present inventive concept is not limited thereto. In some embodiments, the lower portion of the gate structure 24 and the upper portion of the gate structure 24 may be separate gate structures spaced apart from each other. Further, although FIG. 2A illustrates the gate structure 24 as a single layer, the gate structure 24 may include multiple layers that include a gate insulator and a gate electrode sequentially stacked on a surface of the lower active region 22_L and a surface of the upper active region 22_U.

The gate structure 24 may be electrically connected to an input node through a lower via 32, a first metal via 34_1, and a first metal line 36_1. The first metal line 36_1 may extend in the second direction Y as illustrated in FIG. 2A but the present inventive concept is not limited thereto. In some embodiments, the first metal line 36_1 may extend in the first direction X. In some embodiments, the lower via 32 may be omitted, and the gate structure 24 may contact the first metal via 34_1.

The second lower source/drain region 26_L2 and the second upper source/drain region 26_U2 may be electrically connected to each other through an output via 10. In some embodiments, the output via 10 may contact both the second lower source/drain region 26_L2 and the second upper source/drain region 26_U2. In some embodiments, the second upper source/drain region 26_U2 may be electrically connected to the output via 10 through a routing contact (e.g., a second upper routing contact 27_U2 in FIG. 5C), and the second lower source/drain region 26_L2 may be electrically connected to the output via 10 through a routing contact (e.g., a second lower routing contact 27_L2 in FIG. 5C).

The second upper source/drain region 26_U2 may be electrically connected to an output node through a second metal via 34_2 and a second metal line 36_2. The second metal line 36_2 may extend in the second direction Y as illustrated in FIG. 2B but the present inventive concept is not limited thereto. In some embodiments, the second metal line 36_2 may extend in the first direction X.

Figure 3:
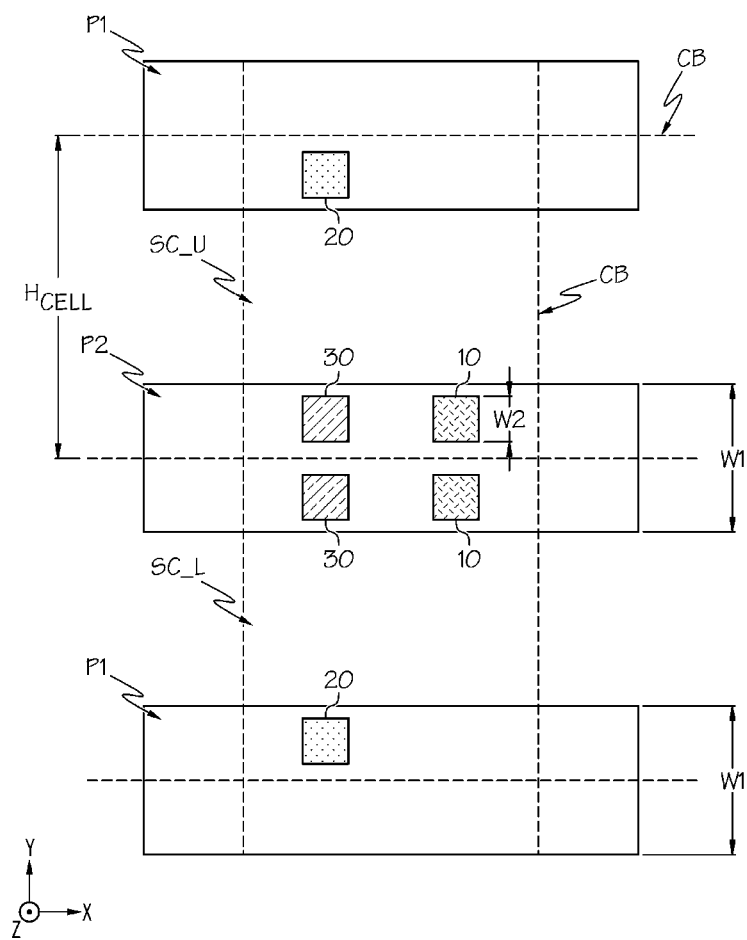
FIG. 3 is a schematic layout of two standard cells, each of which includes the inverter of FIG. 1.

FIG. 3 is a schematic layout of two standard cells (e.g., lower and upper standard cells SC_L and SC_U), each of which includes the inverter of FIG. 1. FIG. 3 shows only power lines (e.g., the first and second power lines P1 and P2) and vias (the output vias 10 and the first and second power vias 20 and 30) for simplicity of illustration. The dotted lines represent cell boundaries.

Referring to FIG. 3, when both of the lower and upper standard cells SC_L and SC_U that are immediately adjacent to each other in the second direction Y have their output vias 10 adjacent to the cell boundary CB therebetween, a space has to be provided between the output vias 10 for electrical isolation therebetween. The output vias 10 of the lower and upper standard cells SC_L and SC_U may be spaced apart from the cell boundary CB. Therefore, in some embodiments, a first width W1 of a power line (e.g., the second power line P2) between the standard cells may be greater than two times a second width W2 of each of the output vias 10. The space between the output vias 10 of the lower and upper standard cells SC_L and SC_U may increase a cell height Hcell of each of the lower and upper standard cells SC_L and SC_U.

Figure 4:
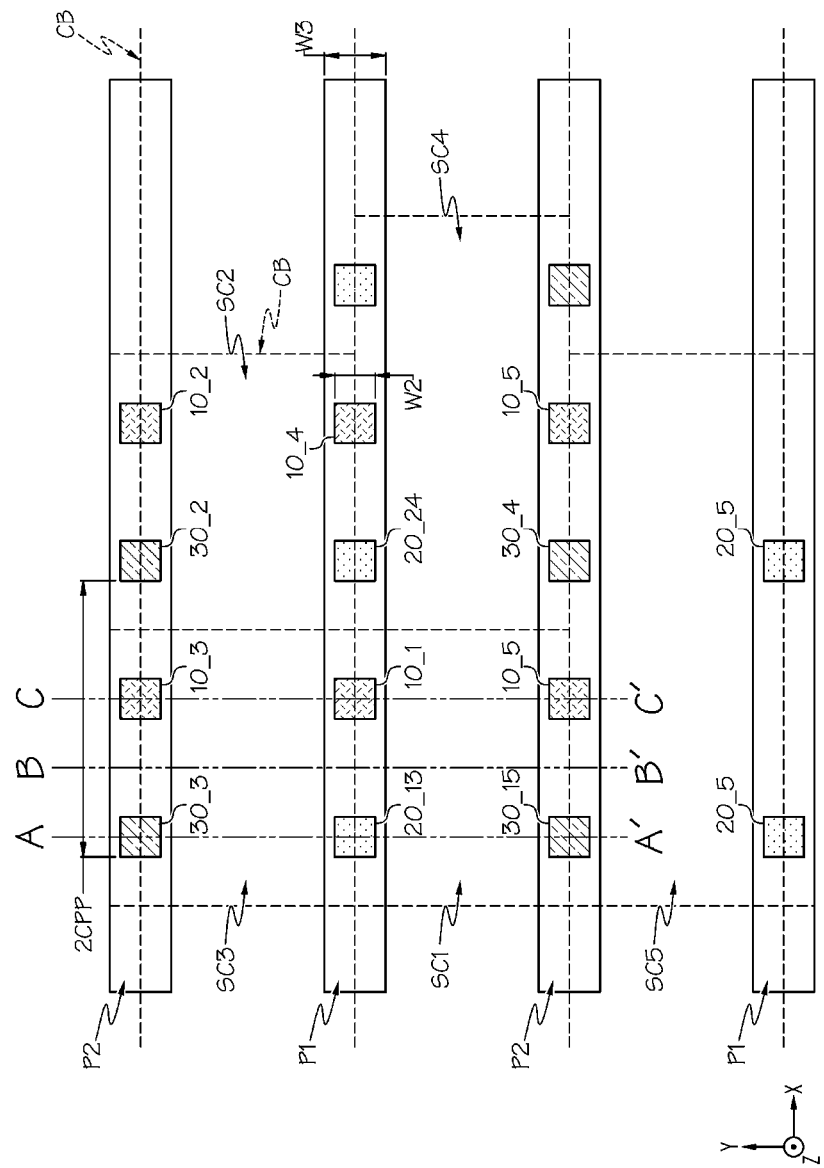
FIG. 4 is a schematic layout of an integrated circuit device including multiple standard cells according to some embodiments of the present inventive concept.
Figure 5A:
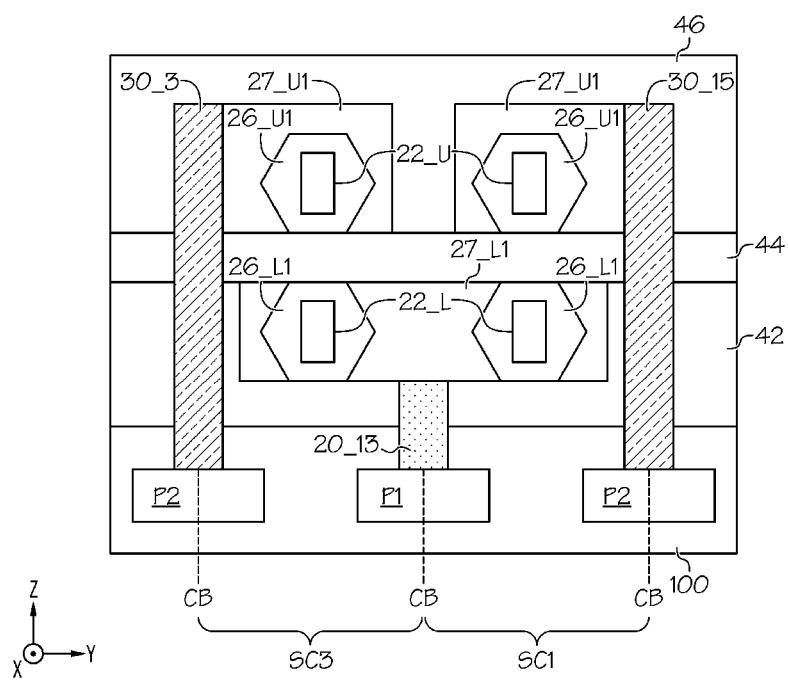
FIGS. 5A, 5B, and 5C are cross-sectional views taken along the lines A-A', B-B', and C-C' of FIG. 4, respectively, according to some embodiments of the present inventive concept.
Figure 5B:
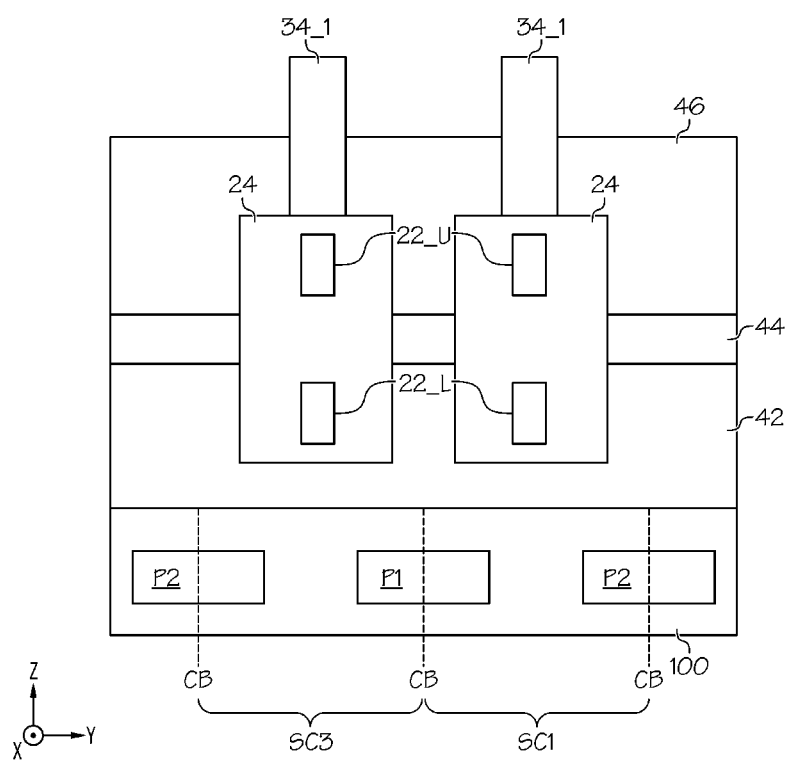
Figure 5C:
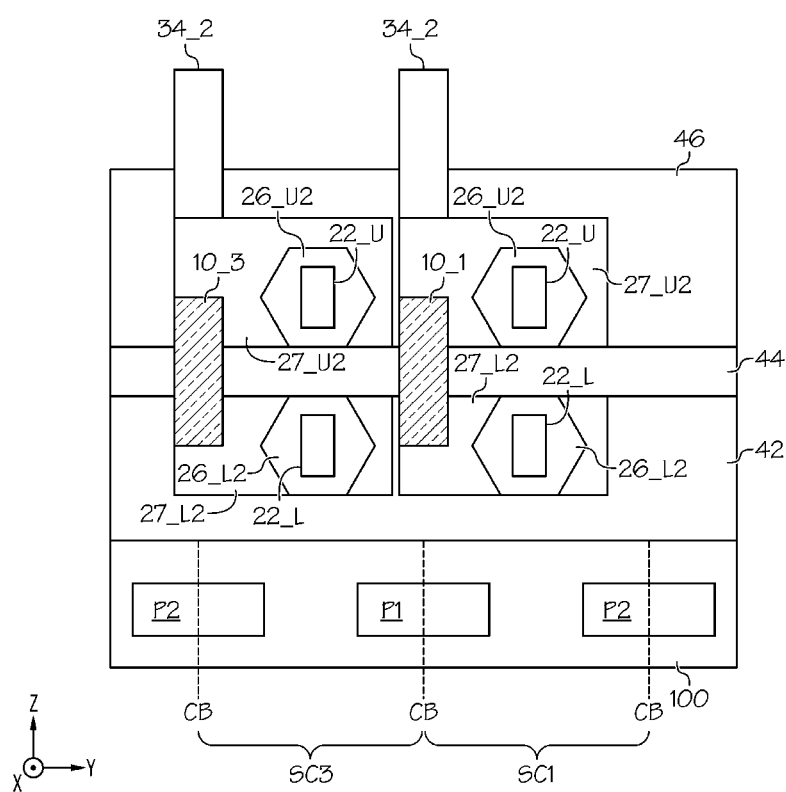

FIG. 4 is a schematic layout of an integrated circuit device including multiple standard cells according to some embodiments of the present inventive concept. FIG. 4 shows only power lines and vias for simplicity of illustration. FIGS. 5A, 5B, and 5C are cross-sectional views taken along the lines A-A', B-B', and C-C' of FIG. 4, respectively, according to some embodiments of the present inventive concept.

Referring to FIG. 4, an integrated circuit device may include multiple standard cells (e.g., a first standard cell SC1, a second standard cell SC2, a third standard cell SC3, a fourth standard cell SC4, and a fifth standard cell SC5) arranged in multiple rows, each of which may extend in the first direction X. A first row may include the first standard cell SC1 and the fourth standard cell SC4, and a second row that is immediately adjacent to the first row in the second direction Y may include the second standard cell SC2 and the third standard cell SC3, and a third row that is also immediately adjacent to the first row in the second direction Y may include the fifth standard cell SC5. The first row may contact the second row, and an interface between the first row and the second row defines a cell boundary CB.

In some embodiments, the first standard cell SC1, the second standard cell SC2, and the third standard cell SC3 may be the same kind of cell. For example, each of the first standard cell SC1, the second standard cell SC2, and the third standard cell SC3 may include the inverter illustrated in FIGS. 1, 2A, and 2B. A fourth standard cell SC4 may be a 2-input NOR gate, and a fifth standard cell SC5 may be a standard cell including multiple outputs.

Output vias 10_1, 10_2, 10_3, 10_4, and 10_5 are output vias of the first standard cell SC1, the second standard cell SC2, the third standard cell SC3, the fourth standard cell SC4, and the fifth standard cell SC5, respectively. According to some embodiments of the present inventive concept, only one standard cell of two standard cells that are immediately adjacent to each other in the second direction Y may have its output via(s) adjacent to a cell boundary CB therebetween, and these output via(s) may be arranged along the cell boundary CB as illustrated in FIG. 4.

The first standard cell SC1 and the third standard cell SC3 are immediately adjacent to each other in the second direction Y, and only the first standard cell SC1 has its output via 10_1 adjacent to the cell boundary CB between the first and third standard cells SC1 and SC3. The third standard cell SC3 has its output via 10_3 adjacent to the cell boundary CB that is opposite to the cell boundary CB between the first and third standard cells SC1 and SC3. Accordingly, an additional space for electrical isolation between the output vias 10_1 and 10_3 of the first and third standard cells SC1 and SC3 may not be provided adjacent to the cell boundary CB between the first and third standard cells SC1 and SC3. According to some embodiments of the present inventive concept, a third width W3 of a power line (e.g., the first power line P1) between the standard cells (e.g., the first and third standard cells SC1 and SC3) may be narrower than two times the second width W2 of each of the output vias (e.g., 10_1 and 10_3). In some embodiments, the third width W3 of the power line may be equal to the second width W2 of the output via(s).

In some embodiments, the output via 10_1 of the first standard cell SC1 may overlap the cell boundary CB between the first and third standard cells SC1 and SC3. In some embodiments, a center of the output via 10_1 of the first standard cell SC1 in the second direction Y may overlap the cell boundary CB between the first and third standard cells SC1 and SC3 as illustrated in FIG. 4. In some embodiments, the output vias (e.g., 10_1, 10_3, and 10_5) of standard cells (e.g., the first, third, and fifth standard cells SC1, SC3, SC5) that are arranged in the second direction Y may be aligned in the second direction Y as illustrated in FIG. 4. The phrase "an element A overlapping an element B" (or similar language) as used herein means that a vertical line exists that intersects both the elements A and B. Further, the phrase "a center of an element A in the second direction Y" (or similar language) as used herein refers to an axis of the element A, which is centered in the second direction Y and extends in the first direction X.

Still referring to FIG. 4, the integrated circuit device may include a first power via 20_13 shared by the first and third standard cells SC1 and SC3, a first power via 20_24 shared by the second and fourth standard cells SC2 and SC4, first power vias 20_5 of the fifth standard cell SC5, a second power via 30_15 shared by the first and fifth standard cells SC1 and SC5, a second power via 30_2 of the second standard cell SC2, a second power via 30_3 of the third standard cell SC3, and a second power via 30_4 of the fourth standard cell SC4.

In some embodiments, power vias (e.g., the first power vias 20_13 and 20_24) of standard cells (e.g., the first standard cell SC1 and the second standard cell SC2) in two rows immediately adjacent to each other in the second direction Y may be aligned in the first direction X and may be spaced apart from each other by two times a contacted poly pitch (CPP) of the integrated circuit device as illustrated in FIG. 4. Further, power vias (e.g., the second power vias 30_2 and 30_3) of standard cells (e.g., the second standard cell SC2 and the third standard cell SC3) in the same row may be aligned in the first direction X and may be spaced apart from each other by two times the CPP of the integrated circuit device as illustrated in FIG. 4.

In some embodiments, one of the first power vias 20_5 of the fifth standard cell SC5 may be omitted, and first power vias of standard cells in the same row may be spaced apart from each other by a distance longer than 2CPP. In some embodiments, the integrated circuit device may include at least one power via (e.g., the second power via 30_4) that may not be shared by two standard cells immediately adjacent to each other in the second direction Y.

Referring to FIGS. 4 and 5A, the first standard cell SC1 and the third standard cell SC3 may be provided on a substrate 100. The first power line P1 and the second power lines P2 may be provided in the substrate 100 as illustrated in FIG. 5A but the present inventive concept is not limited thereto. In some embodiments, the first power line P1 and the second power lines P2 may be provided on a surface of the substrate 100 or may be spaced apart from the surface of the substrate 100 in the third direction Z. The first standard cell SC1 may contact the third standard cell SC3, and an interface between the first standard cell SC1 and the third standard cell SC3 may define a cell boundary CB.

The first standard cell SC1 and the third standard cell SC3 may share a first power via 20_13 (also referred to as a shared first power via) and a first power line P1 (also referred to as a shared first power line). The first power via 20_13 may overlap a cell boundary CB between the first standard cell SC1 and the third standard cell SC3. In some embodiments, a center of the first power via 20_13 in the second direction Y may be aligned with the cell boundary CB between the first standard cell SC1 and the third standard cell SC3 along the third direction Z as illustrated in FIGS. 4 and 5A. The first power line P1 may also overlap the cell boundary CB between the first standard cell SC1 and the third standard cell SC3. In some embodiments, a center of the first power line P1 in the second direction Y may overlap the cell boundary CB between the first standard cell SC1 and the third standard cell SC3 as illustrated in FIGS. 4 and 5A.

The first lower source/drain region 26_L1 of the first standard cell SC1 and the first lower source/drain region 26_L1 of the third standard cell SC3 may be electrically connected to the first power via 20_13 through a first lower routing contact 27_L1. In some embodiments, the first lower routing contact 27_L1 may be omitted, and each of the first lower source/drain region 26_L1 of the first standard cell SC1 and the first lower source/drain region 26_L1 of the third standard cell SC3 may contact the first power via 20_13.

The first standard cell SC1 may include a second power via 30_15 that is shared with the fifth standard cell SC5. Elements of the fifth standard cell SC5 are not shown in FIG. 5A for simplicity of illustration. The first upper source/drain region 26_U1 of the first standard cell SC1 may be electrically connected to the second power via 30_15 through a first upper routing contact 27_U1. The third standard cell SC3 may include a second power via 30_3 that may be electrically connected to the first upper source/drain region 26_U1 of the third standard cell SC3 through a first upper routing contact 27_U1. In some embodiments, the first upper routing contacts 27_U1 of the first standard cell SC1 and the third standard cell SC3 may be omitted, and the first upper source/drain regions 26_U1 of the first standard cell SC1 and the third standard cell SC3 may contact the second power vias 30_15 and 30_3, respectively.

Each of the second power vias 30_15 and 30_3 may overlap the cell boundary CB. In some embodiments, a center of each of the second power vias 30_15 and 30_3 in the second direction Y may be aligned with a respective cell boundaries CB along the third direction Z as illustrated in FIG. 5A.

The first standard cell SC1 and the third standard cell SC3 may further include a first insulating layer 42, a second insulating layer 44, and a third insulating layer 46 to electrically isolate elements (e.g., the first upper routing contacts 27_U1) therein.

Referring to FIG. 5B, a gate structure 24 of each of the first standard cell SC1 and the third standard cell SC3 may enclose the lower active region 22_L and the upper active region 22_U. Each of the first and third standard cells SC1 and SC3 may include a first metal via 34_1 that may be electrically connected to the gate structure 24. The gate structures 24 of the first and third standard cells SC1 and SC3 may be electrically isolated from each other by the first insulating layer 42, the second insulating layer 44, and the third insulating layer 46.

Referring to FIG. 5C, each of the first and third standard cells SC1 and SC3 may include a second lower source/drain region 26_L2 and a second upper source/drain region 26_U2 that are electrically connected to each other through the output via 10_1. The second lower source/drain region 26_L2 and the second upper source/drain region 26_U2 may be electrically connected to the output via 10_1 through a second lower routing contact 27_L2 and a second upper routing contact 27_U2, respectively. However, in some embodiments, the second lower routing contact 27_L2 and the second upper routing contact 27_U2 may be omitted, and the second lower source/drain region 26_L2 and the second upper source/drain region 26_U2 may contact the output via 10_1. Each of the first and third standard cells SC1 and SC3 may also include a second metal via 34_2 electrically connected to the second upper routing contact 27_U2.

Referring to FIGS. 4 and 5C, the first standard cell SC1 is a first type standard cell that includes the output via 10_3 adjacent to its first power via 20_13. In some embodiments, the output via 10_1 of the first standard cell SC1 may overlap the first power line P1 and may overlap the cell boundary CB between the first and third standard cells SC1 and SC3 as illustrated in FIG. 5C. In contrast, the third standard cell SC3 is a second type standard cell that includes the output via 10_1 adjacent to its second power via 30_3. The second power via 30_3 may overlap the second power line P2 and may overlap the cell boundary CB opposite to the cell boundary CB between the first and third standard cells SC1 and SC3. The second standard cell SC2 may also be the second type standard cell that includes the output via 10_2 adjacent to its second power via 30_2.

According to some embodiments of the present inventive concept, standard cells of different types (e.g., the first standard cell SC1 and the third standard cell SC3) may be placed in two rows immediately adjacent each other in a cell height direction (e.g., the second direction Y) and thus output vias thereof may be spaced apart from each other in the cell height direction.

Figure 6:
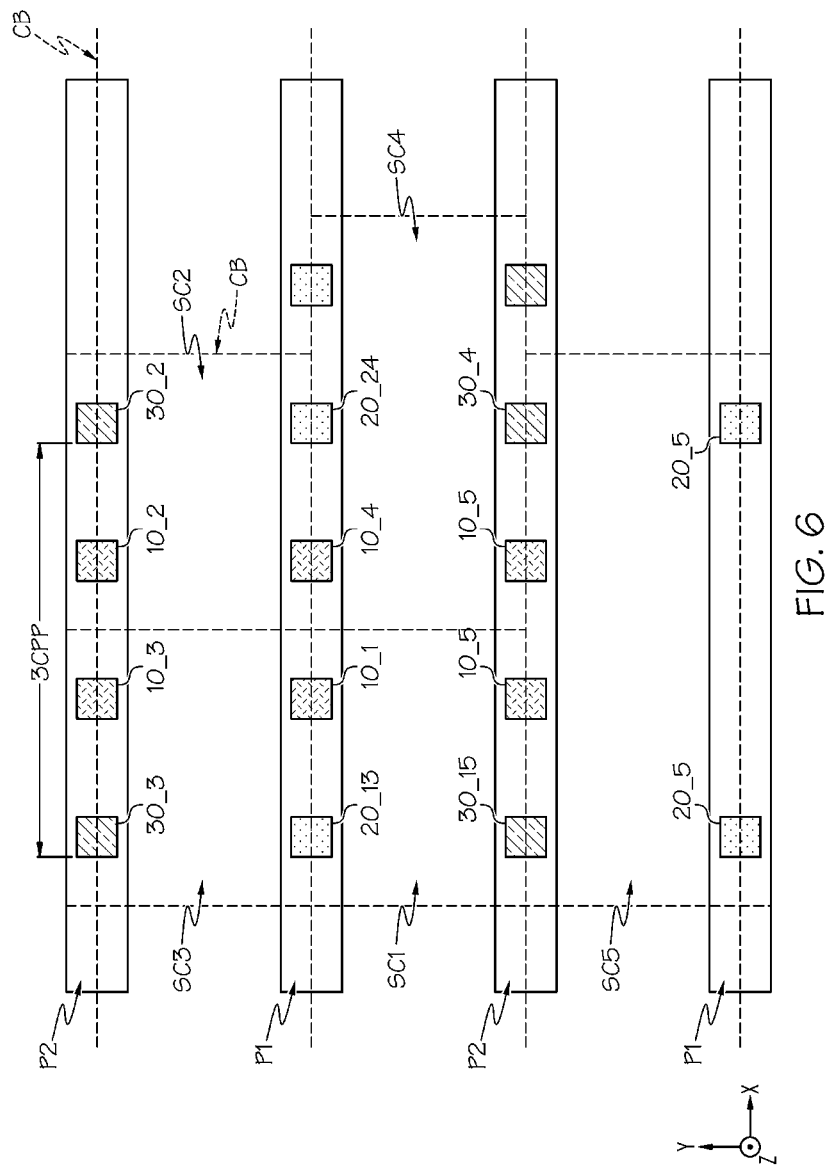
FIG. 6 is a schematic layout of an integrated circuit device including multiple standard cells according to some embodiments of the present inventive concept.

FIG. 6 is a schematic layout of an integrated circuit device including multiple standard cells according to some embodiments of the present inventive concept. FIG. 6 shows only power lines and vias for simplicity of illustration. The integrated circuit device illustrated in FIG. 6 may be similar to the integrated circuit device discussed herein with reference to FIGS. 4, 5A, 5B, and 5C except for a distance between two power vias in the same row. Referring to FIG. 6, in some embodiments, two power vias (e.g., first power vias 20_13 and 20_24 or second power vias 30_3 and 30_2) of standard cells in the same row may be spaced apart from each other by three times a contacted poly pitch (CPP) of the integrated circuit device in the first direction X.

Figure 7:
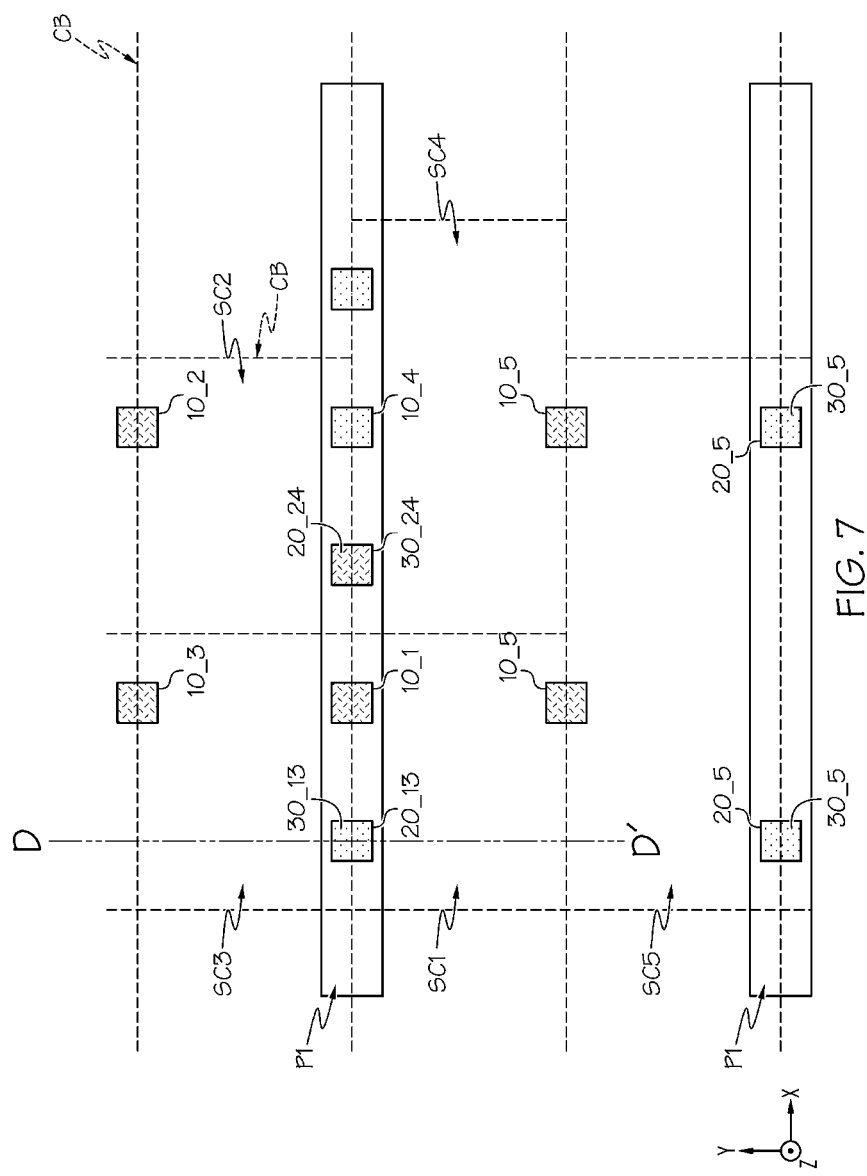
FIG. 7 is a schematic layout of an integrated circuit device including multiple standard cells according to some embodiments of the present inventive concept.
Figure 8:
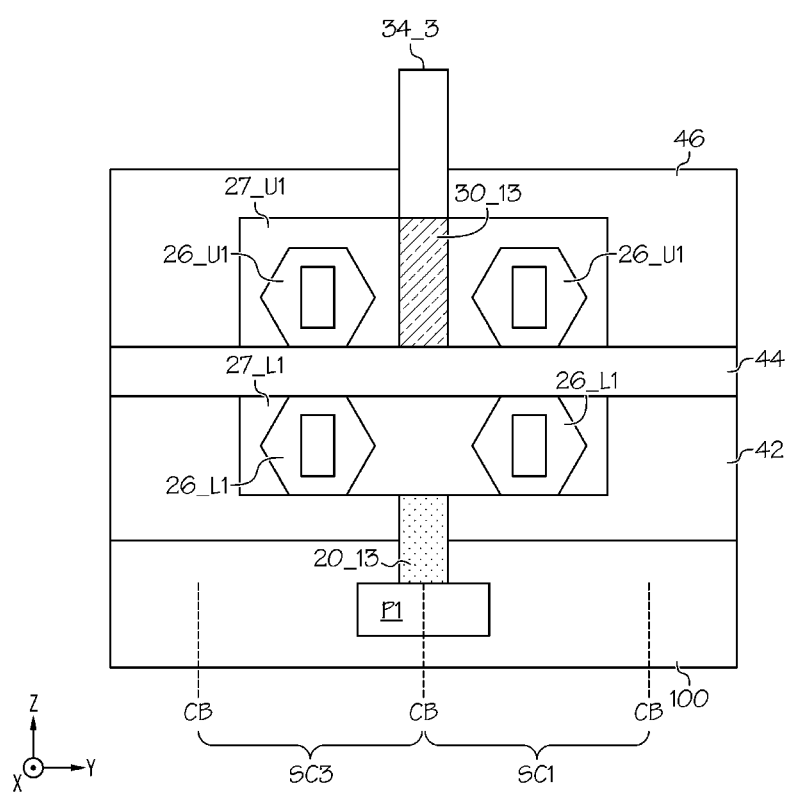
FIG. 8 is a cross-sectional view taken along the line D-D' of FIG. 7 according to some embodiments of the present inventive concept.

FIG. 7 is a schematic layout of an integrated circuit device including multiple standard cells according to some embodiments of the present inventive concept. FIG. 7 shows only power lines and vias for simplicity of illustration. The integrated circuit device illustrated in FIG. 7 may be similar to the integrated circuit device discussed herein with reference to FIGS. 4, 5A, 5B, and 5C except for locations of second power vias. FIG. 8 is a cross-sectional view taken along the line D-D' of FIG. 7 according to some embodiments of the present inventive concept.

Referring to FIGS. 7 and 8, each of standard cells may include a first power via (e.g., a first power via 20_13) and a second power via (e.g., a second power via 30_13) overlapping its first power via. The first standard cell SC1 and the third standard cell SC3 may share a second power via 30_13 (also referred to as a shared second power via) and a third metal via 34_3 (also referred to as a shared third metal via). The first upper source/drain regions 26_U1 of the first standard cell SC1 and the third standard cell SC3 may be electrically connected to the second power line P2 having a second voltage (e.g., a drain voltage) through the shared second power via 30_13 and the shared third metal via 34_3. The second power via 30_13 may overlap the cell boundary CB between the first and third standard cells SC1 and SC3. In some embodiments, a center of the second power via 30_13 in the second direction Y may overlap the cell boundary CB between the first and third standard cells SC1 and SC3 as illustrated in FIGS. 7 and 8.

According to some embodiments of the present inventive concept, an integrated circuit device may include a double height standard cell that has a wider channel width compared with a single height standard cell.

Figure 9:
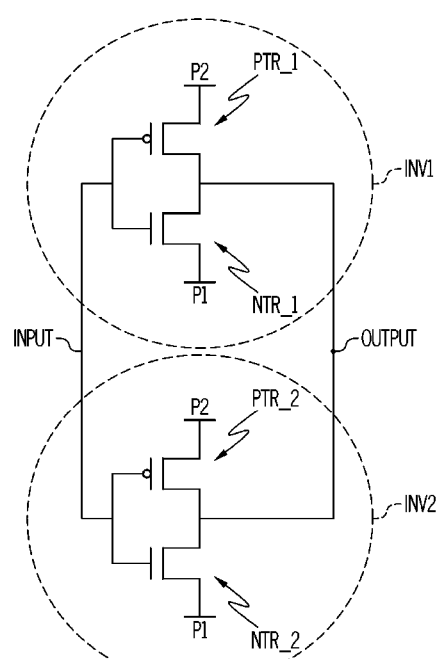
FIG. 9 is a circuit diagram of an inverter having a double height according to some embodiments.
Figure 10:
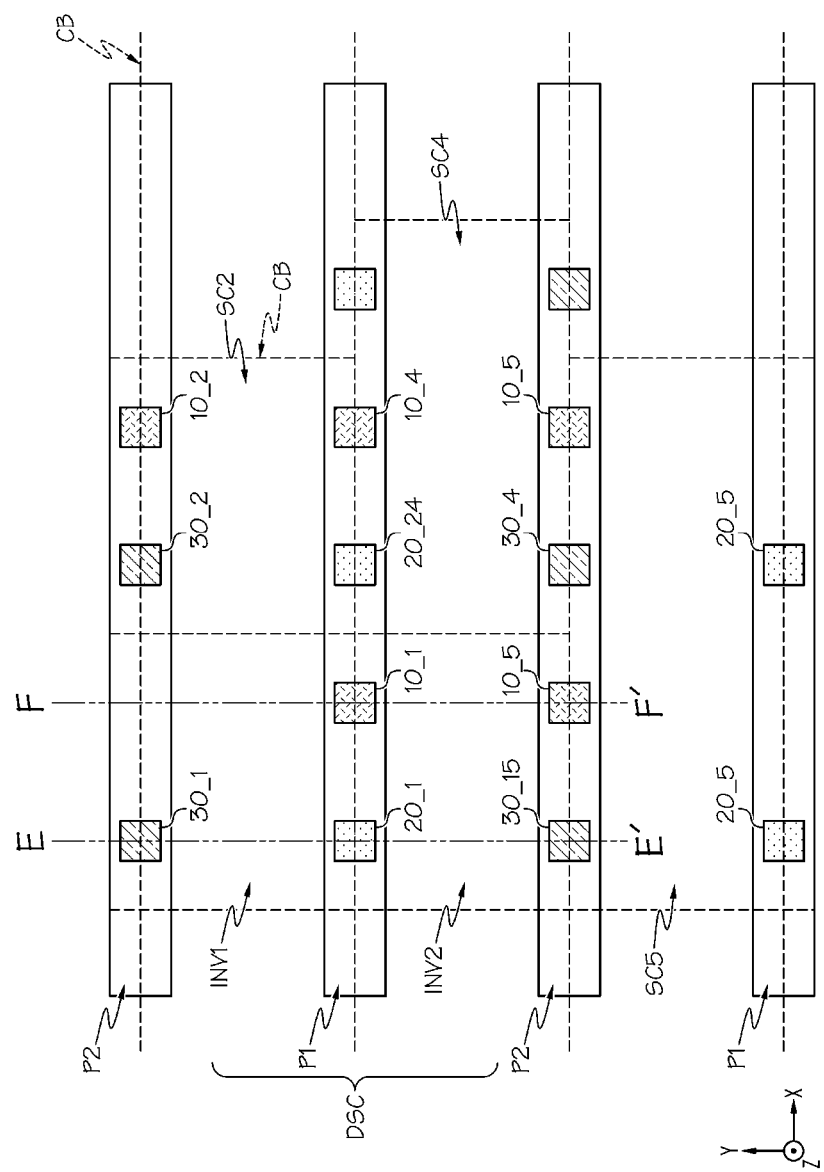
FIG. 10 is a schematic layout of an integrated circuit device including multiple standard cells according to some embodiments of the present inventive concept.
Figure 11A:
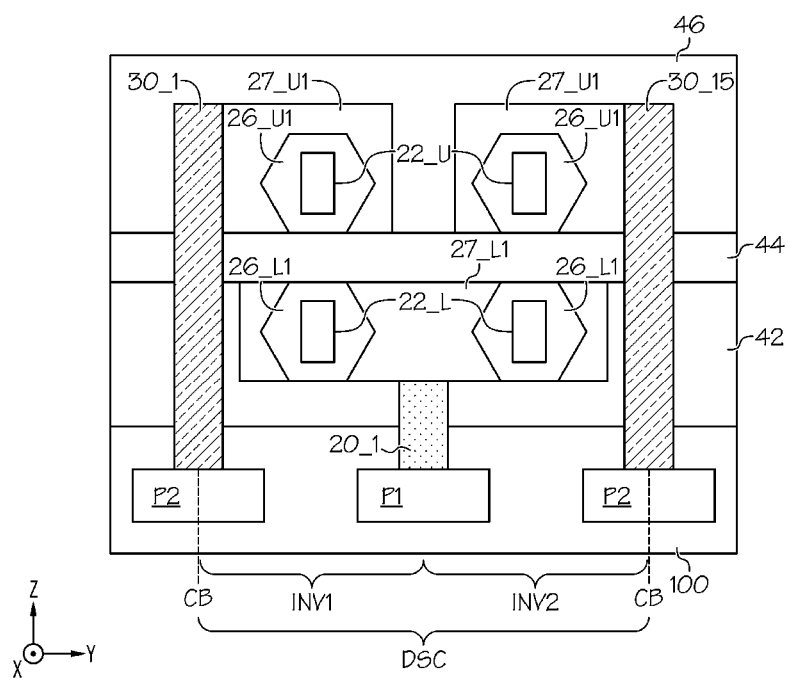
FIGS. 11A and 11B are cross-sectional views taken along the lines E-E' and F-F' of FIG. 10, respectively, according to some embodiments of the present inventive concept.
Figure 11B:
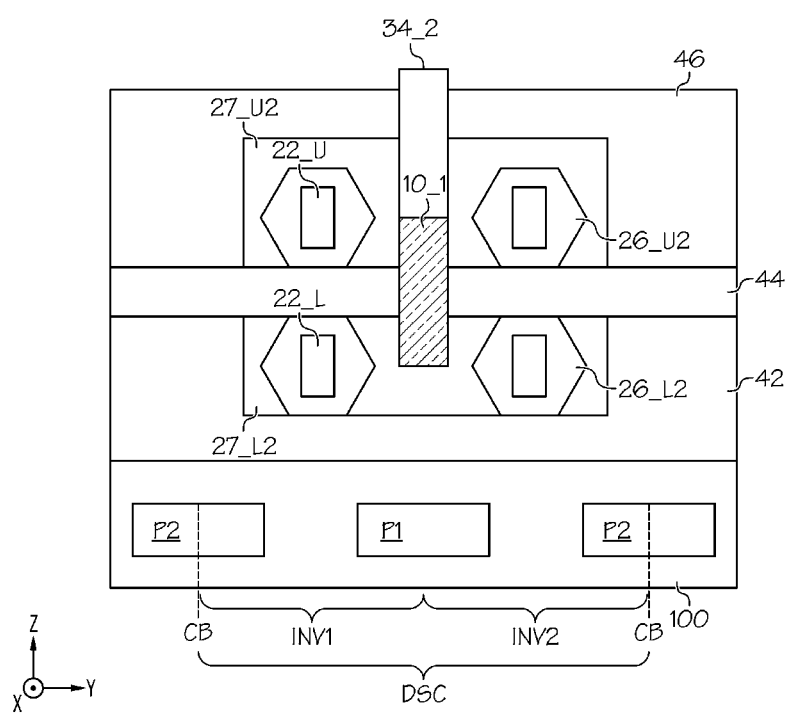

FIG. 9 is a circuit diagram of an inverter having a double height according to some embodiments, and FIG. 10 is a schematic layout of an integrated circuit device including multiple standard cells according to some embodiments of the present inventive concept. FIG. 10 shows only power lines and vias for simplicity of illustration. FIGS. 11A and 11B are cross-sectional views taken along the lines E-E' and F-F' of FIG. 10, respectively, according to some embodiments of the present inventive concept. The integrated circuit device illustrated in FIGS. 10, 11A and 11B may be similar to the integrated circuit device described herein with reference to FIGS. 4, 5A, 5B, and 5C except that a double height standard cell DSC is in the position of the first and third standard cells SC1 and SC3.

In some embodiments, the double height standard cell DSC in FIG. 10 may be the inverter of FIG. 9. Referring to FIG. 9, the inverter may include a first inverter INV1 and a second inverter INV2. The first inverter INV1 may include a first P-type transistor PTR_1 as an upper transistor and a first N-type transistor NTR_1 as a lower transistor. The second inverter INV2 may include a second P-type transistor PTR_2 as an upper transistor and a second N-type transistor NTR_2 as a lower transistor. The first inverter INV1 and the second INV2 may be configured to receive a common input Input and may be configured to output a common output Output.

Referring to FIG. 10, the first inverter INV1 of the double height standard cell DSC may be in a row in which the second standard cell SC2 is placed, and the second inverter INV2 of the double height standard cell DSC may be in a row in which the fourth standard cell SC4 is placed.

Referring to FIG. 11A, a second power via 20_1 may be electrically connected to a first lower source/drain region 26_L1 of the first inverter INV1 and a first lower source/drain region 26_L1 of the second inverter INV2. Referring to FIG. 11B, an output via 10_1 may be electrically connected to second lower source/drain regions 26_L2 and second upper source/drain regions 26_U2 of the first and the second inverters INV1 and INV2.

It will be understood that the present inventive concept is also applicable to standard cells with various heights (e.g., a triple height standard cell or a quadruple height standard cell).

Figure 12A:
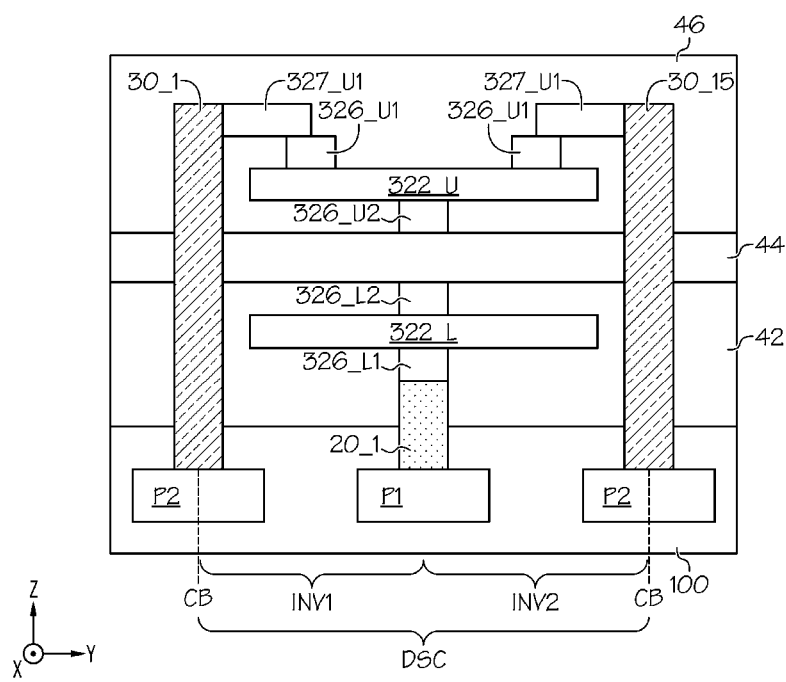
FIGS. 12A and 12B are cross-sectional views taken along the lines E-E' and F-F' of FIG. 10, respectively, according to some embodiments of the present inventive concept.
Figure 12B:
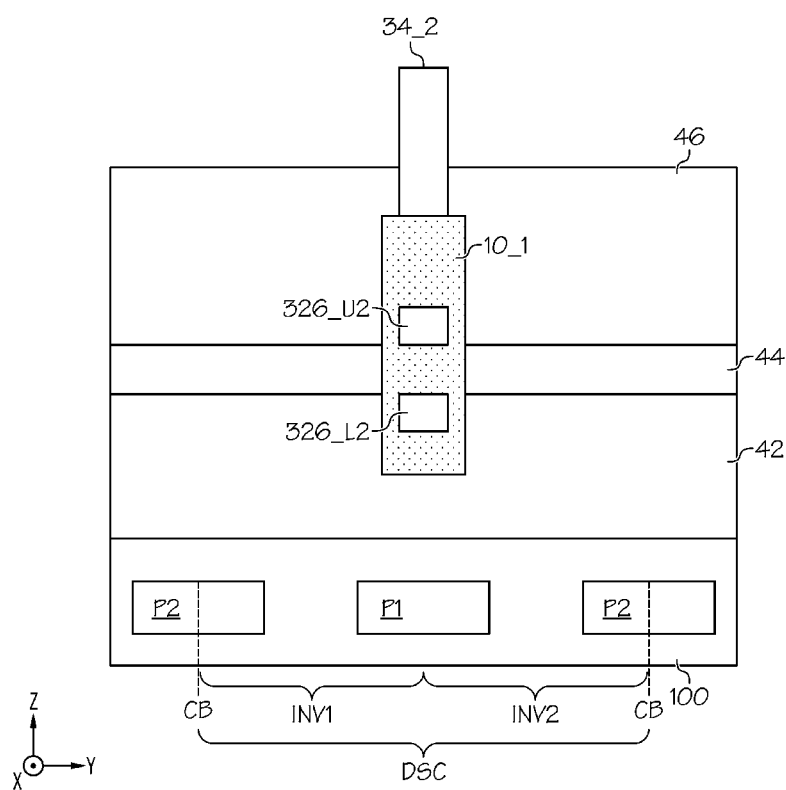

FIGS. 12A and 12B are cross-sectional views taken along the lines E-E' and F-F' of FIG. 10, respectively, according to some embodiments of the present inventive concept. Referring to FIGS. 9, 10, 12A, and 12B, the double height standard cell DSC is a vertical channel device. The double height standard cell DSC may include an upper channel region 322_U extending in the second direction Y and a lower channel region 322_L extending in the second direction Y. Both of the upper channel region 322_U and the lower channel region 322_L may cross over the first power line P1. A first portion of the upper channel region 322_U may be a channel region of the first P-type transistor PTR 1, and a second portion of the upper channel region 322_U may be a channel region of the second P-type transistor PTR_2. A first portion of the lower channel region 322_L may be a channel region of the first N-type transistor NTR_1, and a second portion of the lower channel region 322_L may be a channel region of the second N-type transistor NTR_2.

In some embodiments, the first and second N-type transistors NTR_1 and NTR_2 may include a single first lower source/drain region 326_L1. The first lower source/drain region 326_L1 may be electrically connected to a first power line P1 through a first power via 20_1. In some embodiments, the first power via 20_1 may contact the first power line P1 and the first lower source/drain region 326_L1.

In some embodiments, each of the first and second P-type transistors PTR 1 and PTR_2 may include a first upper source/drain region 326_U1 on the upper channel region 322_U. In some embodiments, the first upper source/drain regions 326_U1 may contact the upper channel region 322_U. Each of the first upper source/drain regions 326_U1 may be electrically connected to a second power via (e.g., 30_1 or 30_15) through a first upper routing contact 327_U1. In some embodiments, the first upper routing contacts 327_U1 may be omitted, and each of the first upper source/drain regions 326_U1 may contact the second power via (e.g., 30_1 or 30_15).

The double height standard cell DSC may include a second upper source/drain region 326_U2 electrically connected to the upper channel region 322_U. In some embodiments, the second upper source/drain region 326_U2 may contact the upper channel region 322_U. The double height standard cell DSC may also include a second lower source/drain region 326_L2 electrically connected to the lower channel region 322_L. In some embodiments, the second lower source/drain region 326_L2 may contact the lower channel region 322_L. Each of the second upper source/drain region 326_U2 and the second lower source/drain region 326_L2 may extend in the first direction X.

Referring to FIG. 12B, each of the second upper source/drain region 326_U2 and the second lower source/drain region 326_L2 may be electrically connected to an output via 10_1. The output via 10_1 may contact the second upper source/drain region 326_U2 and the second lower source/drain region 326_L2. In some embodiments, the output via 10_1 may enclose the second upper source/drain region 326_U2 and the second lower source/drain region 326_L2 as illustrated in FIG. 12B.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
   a plurality of standard cells arranged on a substrate in multiple rows that each extend in a first direction, wherein the plurality of standard cells comprises a first standard cell in a first row and a second standard cell in a second row that is immediately adjacent to the first row,
   wherein each of the plurality of standard cells comprises:
   an upper transistor comprising:
   an upper active region;
   an upper gate structure on the upper active region; and
   an upper source/drain region on the upper active region;

a lower transistor between the substrate and the upper transistor, the lower transistor comprising:
a lower active region;
a lower gate structure on the lower active region; and
a lower source/drain region on the lower active region;
a power line; and
a power via electrically connecting the power line to the lower source/drain region, and
wherein the power via of the first standard cell and the power via of the second standard cell are aligned with each other along the first direction.

2. The integrated circuit device of claim 1, wherein the power via of the first standard cell and the power via of the second standard cell are aligned with each other along an interface between the first row and the second row.

3. The integrated circuit device of claim 1, wherein the power line of the first standard cell comprises a first portion of a shared power line, and the power line of the second standard cell comprises a second portion of the shared power line, and
wherein the shared power line extends along an interface between the first row and the second row.

4. The integrated circuit device of claim 3, wherein the power via of the first standard cell contacts the shared power line and protrudes upward from the shared power line, and the power via of the second standard cell contacts the shared power line and protrudes upward from the shared power line.

5. The integrated circuit device of claim 4, wherein the power via of the first standard cell contacts a center of the shared power line in a second direction that is perpendicular to the first direction, and the power via of the second standard cell contacts the center of the shared power line in the second direction.

6. The integrated circuit device of claim 1, wherein the upper source/drain region comprises a first upper source/drain region, and the lower source/drain region comprises a first lower source/drain region,
wherein each of the plurality of standard cells further comprises:
a second upper source/drain region on the upper active region;
a second lower source/drain region on the lower active region; and
an output via electrically connecting the second lower source/drain region to the second upper source/drain region, and
wherein the output via of the first standard cell and the power via of the first standard cell are aligned with each other along the first direction.

7. The integrated circuit device of claim 1, wherein the power line of the first standard cell comprises a first portion of a shared power line, and the power line of the second standard cell comprises a second portion of the shared power line,
wherein the plurality of standard cells further comprises a third standard cell in the second row, and
wherein the power via of the first standard cell electrically connects the shared power line to the lower source/drain region of the third standard cell.

8. The integrated circuit device of claim 1, wherein the upper source/drain region comprises a first upper source/drain region, and the lower source/drain region comprises a first lower source/drain region,
each of the plurality of standard cells further comprises:
a second upper source/drain region on the upper active region;
a second lower source/drain region on the lower active region; and
an output via electrically connecting the second lower source/drain region to the second upper source/drain region, and
the output via of the first standard cell overlaps an interface between the first row and the second row.

9. The integrated circuit device of claim 8, wherein a first cell boundary of the second standard cell comprises the interface between the first row and the second row, and
the output via of the second standard cell overlaps a second cell boundary of the second standard cell that is opposite to the first cell boundary.

10. An integrated circuit device comprising:
a plurality of standard cells arranged on a substrate in multiple rows that each extend in a first direction, wherein the plurality of standard cells comprise a first standard cell in a first row and a second standard cell in a second row that is immediately adjacent to the first row; and
a shared power line extending along an interface between the first row and the second row,
wherein each of the plurality of standard cells comprises:
an upper transistor comprising:
an upper active region;
an upper gate structure on the upper active region; and
first and second upper source/drain regions on the upper active region;
a lower transistor between the substrate and the upper transistor, the lower transistor comprising:
a lower active region;
a lower gate structure on the lower active region; and
first and second lower source/drain regions on the lower active region;
a power via electrically connecting the shared power line to the first lower source/drain region; and
an output via electrically connecting the second lower source/drain region and the second upper source/drain region, and
wherein the power via of the first standard cell is spaced apart from the output via of the first standard cell by a first distance in a second direction that is perpendicular to the first direction, the power via of the second standard cell is spaced apart from the output via of the second standard cell by a second distance in the second direction, and the first distance is different from the second distance.

11. The integrated circuit device of claim 10, wherein the first standard cell and the second standard cell are the same kind of standard cell.

12. The integrated circuit device of claim 10, wherein the power via of the first standard cell and the output via of the first standard cell are aligned with each other along the first direction.

13. The integrated circuit device of claim 10, wherein the output via of the first standard cell overlaps the interface between the first row and the second row.

14. The integrated circuit device of claim 13, wherein the second standard cell comprises a first cell boundary comprising the interface between the first row and the second row and a second cell boundary opposite to the first cell boundary, and
wherein the output via of the second standard cell overlaps the second cell boundary of the second standard cell.

15. The integrated circuit device of claim 13, wherein the power via of the second standard cell overlaps the interface between the first row and the second row, and
the output via of the first standard cell and the power via of the second standard cell are aligned with each other along the first direction.

16. The integrated circuit device of claim 10, wherein the plurality of standard cells further comprises a third standard cell that is in the second row and contacts the first standard cell, and
wherein the power via of the first standard cell electrically connects the shared power line to the first lower source/drain region of the third standard cell.

17. The integrated circuit device of claim 10, wherein the power via of the first standard cell contacts the shared power line and protrudes from the shared power line in a vertical direction, and the power via of the second standard cell contacts the shared power line and protrudes from the shared power line in the vertical direction.

18. An integrated circuit device comprising:
a first plurality of standard cells arranged in a first direction;
a second plurality of standard cells that are arranged in the first direction and contact the first plurality of standard cells, wherein an interface between the first plurality of standard cells and the second plurality of standard cells defines a cell boundary; and
wherein the first plurality of standard cells and the second plurality of standard cells each comprises:
an upper transistor on a substrate, the upper transistor comprising:
an upper active region;
an upper gate structure on the upper active region; and
an upper source/drain region on the upper active region;
a lower transistor between the substrate and the upper transistor, the lower transistor comprising:
a lower active region;
a lower gate structure on the lower active region; and
a lower source/drain region on the lower active region; and
an output via that electrically connects the lower source/drain region and the upper source/drain region,
wherein the first plurality of standard cells comprises a first standard cell, and the output via of the first standard cell overlaps the cell boundary.

19. The integrated circuit device of claim 18, wherein the lower source/drain region comprises a first lower source/drain region,
the first plurality of standard cells and the second plurality of standard cells each further comprises:
a second lower source/drain region on the lower active region;
a power line; and
an power via electrically connecting the power line to the second lower source/drain region, and
wherein the power via of the first standard cell overlaps the cell boundary.

20. The integrated circuit device of claim 18, wherein the second plurality of standard cells comprises a second standard cell,
the second standard cell comprises a first cell boundary comprising the cell boundary and a second cell boundary opposite to the first cell boundary, and
the output via of the second standard cell overlaps the second cell boundary of the second standard cell.

* * * * *